(12) United States Patent
Naem

(10) Patent No.: US 6,753,234 B1
(45) Date of Patent: Jun. 22, 2004

(54) METHOD OF FORMING THE SILICON GERMANIUM BASE OF A BIPOLAR TRANSISTOR

(75) Inventor: Abdalla Aly Naem, Overijse (BE)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/994,293

(22) Filed: Nov. 26, 2001

Related U.S. Application Data

(63) Continuation-in-part of application No. 09/882,740, filed on Jun. 15, 2001, now Pat. No. 6,649,482.

(51) Int. Cl.[7] .............................................. H01L 21/331
(52) U.S. Cl. ...................... 438/318; 438/348; 438/359; 438/692
(58) Field of Search ................................ 438/318, 348, 438/359, 430, 692, FOR 165

(56) References Cited

U.S. PATENT DOCUMENTS

| | | | | |
|---|---|---|---|---|
| 4,564,997 A | | 1/1986 | Matsuo et al. ........... 29/576 W |
| 5,077,227 A | * | 12/1991 | Kameyama et al. ........ 438/365 |
| 5,187,554 A | * | 2/1993 | Miwa ......................... 257/586 |
| 5,320,972 A | | 6/1994 | Wylie .......................... 437/31 |
| 5,323,032 A | | 6/1994 | Sato et al. ................... 257/198 |
| 5,362,669 A | * | 11/1994 | Boyd et al. ................. 438/437 |
| 5,508,213 A | * | 4/1996 | Van Der Wel et al. ..... 438/367 |
| 5,648,280 A | * | 7/1997 | Kato .......................... 438/312 |
| 5,897,359 A | | 4/1999 | Cho et al. ................... 438/312 |
| 6,171,936 B1 | * | 1/2001 | Fitzgerald ................... 438/503 |
| 6,333,235 B1 | * | 12/2001 | Lee et al. ................... 438/309 |
| 6,337,251 B1 | * | 1/2002 | Hashimoto ................. 438/309 |
| 6,352,907 B1 | * | 3/2002 | Gris ............................ 438/438 |
| 6,426,265 B1 | * | 7/2002 | Chu et al. .................. 438/312 |
| 6,528,861 B1 | * | 3/2003 | Naem .......................... 257/565 |

FOREIGN PATENT DOCUMENTS

| | | | |
|---|---|---|---|
| EP | 0779663 A2 | 6/1997 | ......... H01L/29/732 |
| JP | 02260430 | 10/1990 | ......... H01L/21/331 |
| JP | 04082268 | 3/1992 | ........... H01L/27/14 |
| JP | 06318602 | 11/1994 | ......... H01L/21/331 |

OTHER PUBLICATIONS

C.A. King et al., "Very Low Cost Graded SiGe Base Bipolar Transistors for a High–Performance Modular BiCMOS Process", IEDM, 1999, pps. 565–568.

Wim van der Wel et al., "Poly–Ridge Emitter Transistor (PRET): Simple Low–Power Option to a Bipolar Process", IEDM, 1993, pps. 453–456.

IBM Technical Disclsure Bulletin, "Epi–Based Bipolar Transistor With Oxide–Defined Collector Window", vol. 34, No. 1, (Jun. 1991), pp. 422–424.

* cited by examiner

Primary Examiner—George Fourson
(74) Attorney, Agent, or Firm—Mark C. Pickering

(57) ABSTRACT

The intrinsic base region of a bipolar transistor is formed to avoid a chemical interaction between the chemicals used in a chemical mechanical polishing step and the materials used to form the base region. The method includes the step of forming a trench in a layer of epitaxial material. After this, a base material that includes silicon and germanium is blanket deposited, followed by the blanket deposition of a layer of protective material. The layer of protective material protects the base material from the chemical mechanical polishing step.

23 Claims, 10 Drawing Sheets

METHOD OF FORMING THE SILICON GERMANIUM BASE OF A BIPOLAR TRANSISTOR

RELATED APPLICATION

The present application is a continuation-in-part of application Ser. No. 09/882,740 filed Jun. 15, 2001, now U.S. Pat. No. 6,649,482, by Abdalla Aly Naem for Bipolar Transistor with a Silicon Germanium Base and an Ultra Small Self-Aligned Polysilicon Emitter and Method of Forming the Transistor.

BACKGROUND OF THE INVENTION

1. Field of the Invention

The present invention relates to bipolar transistors and, more particularly, to a bipolar transistor with an ultra small self-aligned polysilicon emitter and a method of forming the silicon germanium base of the transistor.

2. Description of the Related Art

A bipolar transistor is a three-terminal device that can, when properly biased, controllably vary the magnitude of the current that flows between two of the terminals. The three terminals include a base terminal, a collector terminal, and an emitter terminal. The charge carriers, which form the current, flow between the collector and the emitter terminals, while variations in the voltage on the base terminal cause the magnitude of the current to vary.

Due to the increasing speed of, and demand for, battery-powered devices, there is a need for a faster bipolar transistor that utilizes less power. Increased speed can be obtained by using a silicon germanium base. Lower power consumption can be obtained by reducing the maximum current that can flow between the two terminals.

One approach for reducing the maximum current is to reduce the size of the base-to-emitter junction, preferably to sub-lithographic feature sizes. FIG. 1 shows a cross-sectional diagram that illustrates a portion of a prior-art bipolar transistor 100 that has a base-to-emitter junction with a sub-lithographic width.

As shown in FIG. 1, transistor 100 includes a collector layer 110, a base layer 112 that is formed on collector layer 110, and a field oxide region FOX that adjoins layer 112. In addition, transistor 100 includes a thin oxide layer 114 that is formed on a portion of base layer 112 and the field oxide region FOX, and an n+ extrinsic emitter 116 that is formed on thin oxide layer 114.

As further shown in FIG. 1, transistor 100 also includes an n+ intrinsic emitter region 118 that is formed in base layer 112, and an n+ poly ridge 120 that is connected to extrinsic emitter 116 and n+ intrinsic emitter region 118. Extrinsic emitter 116, intrinsic emitter region 118, and poly ridge 120 form the emitter of transistor 100.

Transistor 100 additionally includes a base silicide contact 122 that is formed on base layer 112, and an emitter silicide contact 124 that is formed on extrinsic emitter 116. In addition, an oxide spacer 126 is formed on base layer 112 between poly ridge 120 and base contact 122.

During fabrication, poly ridge 120 is formed to have a maximum width (measured laterally) that is smaller than the minimum feature size that is obtainable with a given photolithographic process. After poly ridge 120 has been formed, emitter region 118 is formed during an annealing step which causes dopants to outdiffuse from poly ridge 120 into base layer 112.

As a result, a very small base-to-emitter junction results. A small base-to-emitter junction limits the magnitude of the current that can flow through transistor 100. Reduced current, in turn, provides lowpower operation. (See "Poly Emitter Transistor (PRET): Simple Low Power Option to a Bipolar Process," Wim van der Wel, et al., IEDM 93-453, 1993, pp. 17.6.1–17.6.4.)

One drawback of transistor 100, however, is that transistor 100. requires the added cost and complexity of a double polysilicon process (extrinsic emitter 116 is formed from a first polysilicon (poly-1) layers while poly ridge 120 is formed from a second polysilicon (poly-2) layer). In addition, emitter dopant diffusion into base 112 can be less, compared to a conventional single-poly device architecture, due to the possible presence of oxide at the poly1-to-poly2 interface (emitter 116 to poly ridge 120 interface).

Another drawback of transistor 100 is that, although FIG. 1 shows oxide spacer 126 formed on poly ridge 120, in actual practice it is difficult to form an oxide side-wall spacer on a sloped surface. Gaps can result which, in turn, can lead to an electrical short circuit between base layer 112 and extrinsic emitter 116 following the salicidiation process (the process that forms base suicide contact 122 and emitter silicide contact 124). Silicide is not formed on oxide. Thus it is critical that a uniformly thick layer of oxide (spacer 126) separate base layer 112 from extrinsic emitter 116.

A further drawback of transistor 100 is that the slope of the end wall of extrinsic emitter 116 can effect the width of poly ridge 120. Although FIG. 1 shows extrinsic emitter 116 with a vertical end wall, in actual practice, the end wall is often non-vertical, and non-uniform across a wafer that has a number of bipolar transistors. This, in turn, can result in the bipolar transistors having varying performances.

An additional drawback of transistor 100 is that poly ridge 120 is formed around and in contact with each side wall of extrinsic emitter 116. A plan view of extrinsic emitter 116 would show emitter 116 with a square or rectangular shape with poly ridge 120 surrounding emitter 116. As a result, transistor 100 has a large base-to-emitter contact area and a high base-to-emitter capacitance.

The parent invention discloses a bipolar transistor that has a base and an ultra small self-aligned polysilicon emitter. The base, in turn, includes silicon and germanium. The parent invention also discloses a method of forming the transistor that includes a step of chemically-mechanically polishing the base material to limit the base material to a predefined window.

One drawback of this method is that the chemicals used in the chemical-mechanical polishing step could interact with, and change the characteristics of, the base material. One alternate approach to limiting the base material to a predefined window is to use a photo masking step. Although this approach is workable, additional photo masking steps are expensive.

The selective deposition of base material is another alternate approach. This process, however, is very complex and typically has poor process yields due to various manufacturing issues. Thus, there is a need for a method of forming a base without subjecting the base material to damaging chemicals.

SUMMARY OF THE INVENTION

The present invention provides a method of forming a bipolar transistor that protects the base material from chemical interactions that occur during a chemical-mechanical polishing step. The wafer has a buried layer and an epitaxial layer of a first conductivity type that is formed over the buried layer. The epitaxial layer has a smaller dopant concentration than the buried layer.

The method of the present invention includes the steps of forming a trench in the epitaxial layer, and forming a layer of base material on the epitaxial layer and the trench. The method also includes the step of forming a layer of base protection material on the layer of base material.

The method additionally includes the step of chemically mechanically polishing the layer of base protection material, the layer of base material, and the epitaxial layer until a top surface of the epitaxial layer and a top surface of the layer of base protection material are substantially coplanar.

The method further includes the steps of forming an isolation region on the layer of base material and the layer of base protection material, and removing a portion of the layer of base protection material to expose a portion of the layer of base material.

The present invention also includes a bipolar transistor that is formed on a wafer. The wafer has a buried layer and an epitaxial layer of a first conductivity type that is formed over the buried layer. The epitaxial layer has a top surface and a smaller dopant concentration than the buried layer.

The transistor includes an intrinsic base region of a second conductivity type that is formed on the epitaxial layer. The intrinsic base region includes silicon and germanium, and has a first top surface and a vertically spaced-apart second top surface. The transistor also has an isolation region formed on the first top surface of the intrinsic base region and over the second top surface of the intrinsic base region.

The transistor further includes an extrinsic emitter region that is formed on the isolation region and the intrinsic base region. The extrinsic emitter region has a side wall that is substantially aligned with the side wall of the isolation region.

The transistor additionally includes an intrinsic emitter region that is formed in the intrinsic base region. The intrinsic emitter region contacts the extrinsic emitter region. The transistor further includes a spacer that is formed on the intrinsic base region to contact the extrinsic emitter.

A better understanding of the features and advantages of the present invention will be obtained by reference to the following detailed description and accompanying drawings that set forth an illustrative embodiment in which the principles of the invention are utilized.

DETAILED DESCRIPTION

Figure 1:
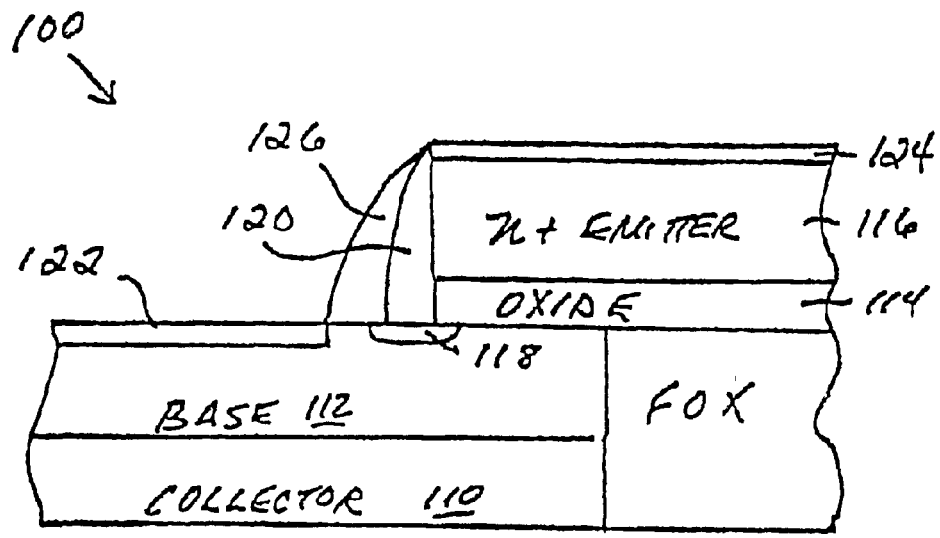
FIG. 1 is a cross-sectional diagram illustrating a portion of a prior-art bipolar transistor 100 that has a base-to-emitter junction with a sub-lithographic width.
Figure 2:
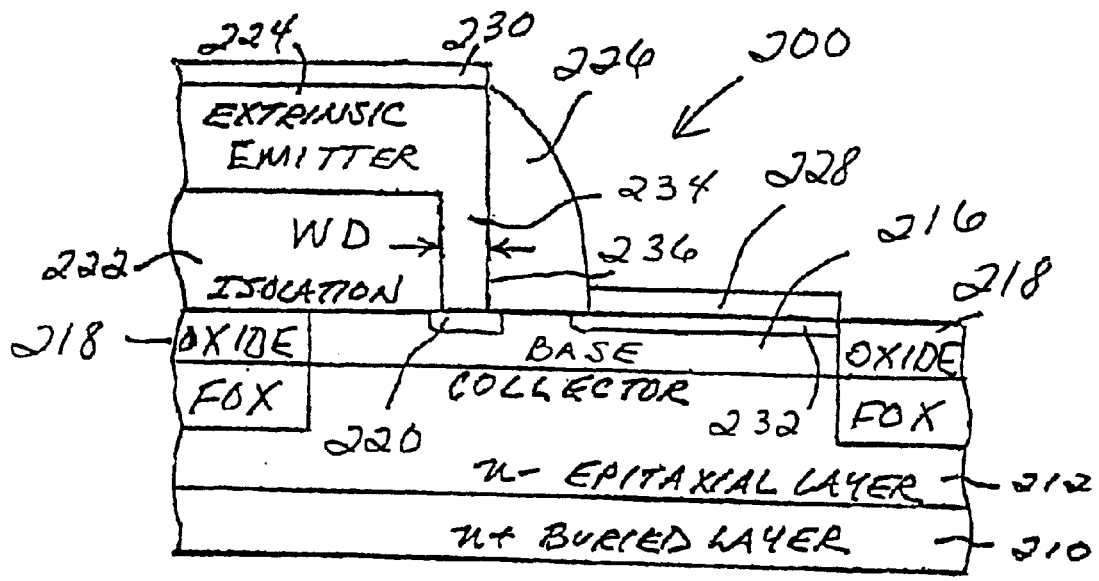
FIG. 2 is a cross-sectional view illustrating a portion of a bipolar transistor 200 in accordance with the parent invention.

FIG. 2 is a cross-sectional view that illustrates a portion of a bipolar transistor 200 in accordance with the parent invention. As shown in FIG. 2, transistor 200 is formed on a wafer that has an n+ buried layer 210, an n− epitaxial layer 212 that is formed over n+ buried layer 210, and a field oxide region FOX that adjoins layer 212. N+ buried layer 210 and n− epitaxial layer 212 form the collector of transistor 200.

As further shown in FIG. 2, transistor 200 includes a p− silicon germanium intrinsic base 216 that is formed on n− epitaxial layer 212, and an oxide layer 218 formed on the field oxide region FOX to surround base 216. By using silicon germanium to form base 216, the speed of transistor 200 is enhanced.

In addition, transistor 200 includes an n+ intrinsic emitter region 220 that is formed in p− intrinsic base 216, and a layer of isolation material 222 that is formed on intrinsic base 216, and oxide layer 218. Transistor 200 further includes an extrinsic emitter 224 that is formed on isolation layer 222, and an oxide spacer 226 that is formed on base 216 adjacent to extrinsic emitter 224.

Transistor 200 also includes a base silicide layer 228 that is formed on base 216, and an emitter silicide layer 230 that is formed on extrinsic emitter 224. Transistor 200 further includes an extrinsic base region 232 that is formed in base 216. Extrinsic base region 232 has a higher dopant concentration than base 216.

As described in greater detail below, silicon germanium intrinsic base 216 is formed in a base window in a self-aligned process that does not require a mask. In addition, the side walls of isolation layer 222 and extrinsic emitter 224 (which are formed over both base region 216 and, oxide layer 218 in the plane parallel to the page) are formed to be substantially aligned.

Further, the method of the present invention forms extrinsic emitter 224 such that an end region 234 of emitter 224 has a width WD that is less than the minimum feature size that can be obtained from the present photolithographic process used to form the wafer. This allows intrinsic emitter region 220 to be very small which, in turn, reduces the size of the base-to-emitter junction.

In addition, extrinsic emitter 224 is formed to have a vertical end wall 236. The advantage of vertical end wall 236 is that a conventional (full height and width) oxide side-wall spacer can then be formed next to vertical end wall 236, thereby providing the necessary base-to-emitter isolation. In addition, vertical end wall 236 minimizes the variability of width WD. Further, emitter 224 is formed to have a high dopant concentration which, as a result of the present method, also allows intrinsic emitter region 220 to have a high dopant concentration.

Figure 3A:
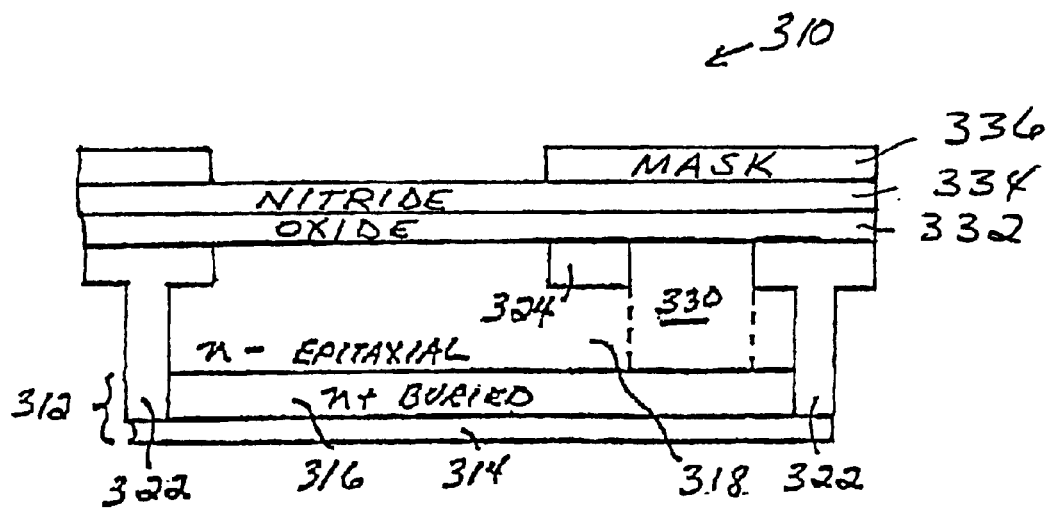
FIGS. 3A–3J are cross-sectional drawings illustrating a method of forming a bipolar transistor in accordance with the parent invention.

FIGS. 3A–3J are cross-sectional views that illustrate a method of forming bipolar transistor 200 in accordance with the parent invention. As shown in FIG. 3A, the method utilizes a conventionally-formed wafer 310 that has a semiconductor layer 312. Semiconductor layer 312, in turn, has a substrate layer 314, such as silicon or oxide, and an n+ buried layer 316. In addition, wafer 310 also has a lightly-doped, n-type epitaxial layer 318 that is formed on n+ buried layer 316.

Wafer 310 further has a deep trench isolation region 322 that isolates epitaxial layer 318 from laterally adjacent regions. A shallow trench isolation region 324 is also formed in epitaxial layer 318. The shallow trench isolation region 324 separates a collector area from a base area of the to-be-formed bipolar transistor.

In addition, wafer 310 can optionally include an n+ diffused contact region 330 that extends down from the surface of the collector area in epitaxial layer 318 to contact n+ buried layer 316. Contact region 330 is utilized to reduce the series resistance to buried layer 316. N+ buried layer 316, n– epitaxial layer 318, and optional n+ diffused contact region 330 define the collector of the to-be-formed bipolar transistor.

As shown in FIG. 3A, the method of the parent invention begins by forming a layer of oxide 332 approximately 40 nm thick on epitaxial layer 318 and contact region 330. Once oxide layer 332 has been formed, a layer of nitride 334 approximately 40 nm thick is formed on oxide layer 332.

Following this, a base definition mask 336 is formed and patterned on nitride layer 334 to expose a region of nitride layer 334. Once mask 336 has been patterned, the exposed regions of nitride layer 334 and underlying oxide layer 332 are etched away to expose a base window on the surface of epitaxial layer 318. Mask 336 is then stripped.

Figure 3B:
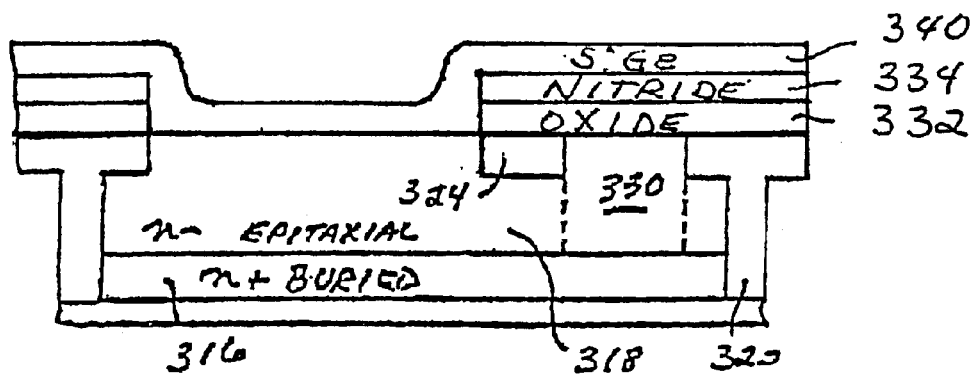

Next, as shown in FIG. 3B, a layer of silicon germanium 340 is blanket deposited on nitride layer 334, the side walls of oxide layer 332, and epitaxial layer 318 in the base window. After silicon germanium layer 340 has been deposited, layer 340 is doped with a p-type dopant using conventional methods, such as ion implantation and diffusion, to have a conductivity type opposite that of n– epitaxial layer 318.

Figure 3C:
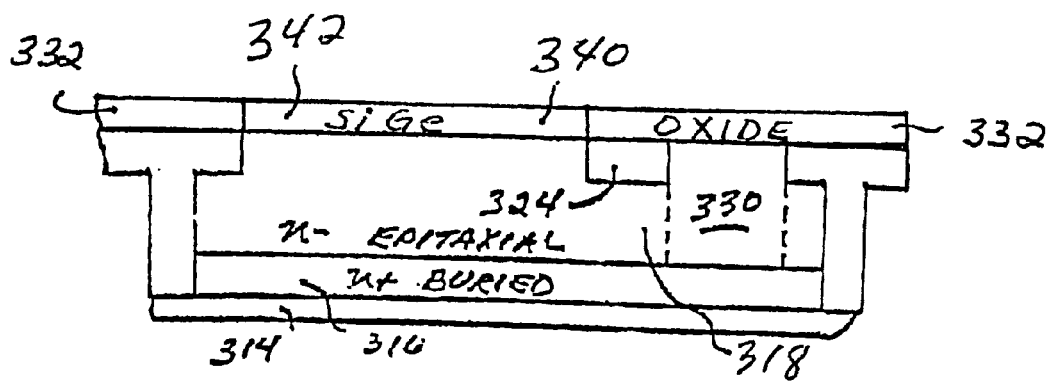

After this, as shown in FIG. 3C, silicon germanium layer 340 and nitride layer 334 are planarized using a conventional approach, such as chemical-mechanical polishing, until nitride layer 334 has been removed from the surface of oxide layer 332. (The etch can alternately be stopped when silicon germanium layer 340 has been removed from the surface of nitride layer 334.)

The planarizing forms a silicon germanium intrinsic base 342 that is self-aligned with, and isolated by, a surrounding layer of oxide 332 without using a mask. Thus, the area of base 342 and the location of the base-to-collector interface are defined by the area and location of mask 336.

The parent method of forming intrinsic base 342 is substantially less complex that the selective growth techniques that are conventionally used to form a silicon germanium base region. With selective growth techniques, a layer of oxide is etched to form a window that exposes a portion of the underlying epitaxial layer, and then a silicon germanium base is grown in the window on the epitaxial layer. The silicon germanium-to-surrounding oxide interface, however, is typically poor and can effect transistor performance.

Figure 3D:
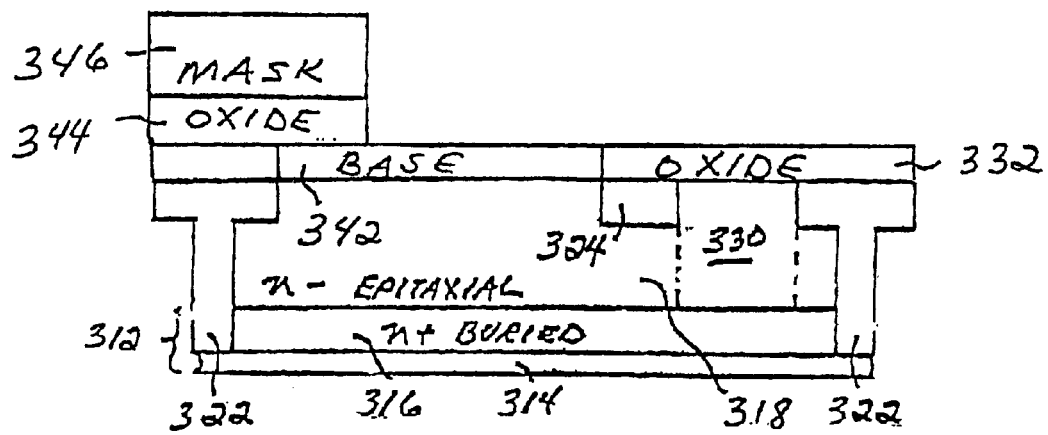

Next, as shown in FIG. 3D, a layer of oxide 344 approximately 20 nm is formed on oxide layer 332 and intrinsic base 342. Following this, an oxide definition mask 346 is formed and patterned on oxide layer 344 to expose a region of oxide layer 344. Once mask 346 has been patterned, the exposed regions of oxide layer 344 are etched away to expose the surface of intrinsic base 342. Mask 346 is then stripped.

Figure 3E:
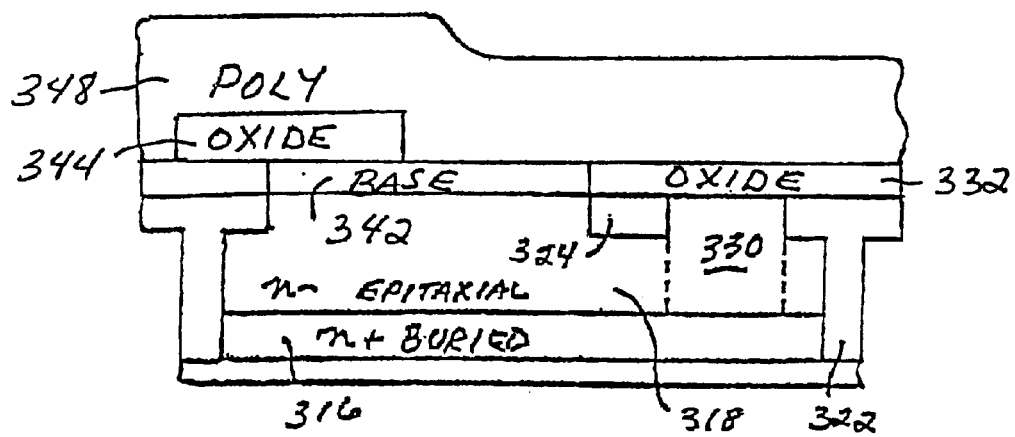

Next, as shown in FIG. 3E, a layer of polysilicon (poly) 348 approximately 250 nm thick is deposited on oxide layer 332, intrinsic base 342, and oxide layer 344. Poly layer 348 is conventionally doped with phosphorous or arsenic, such as by ion implantation or diffusion, to have a high (n+) dopant concentration.

Figure 3F:
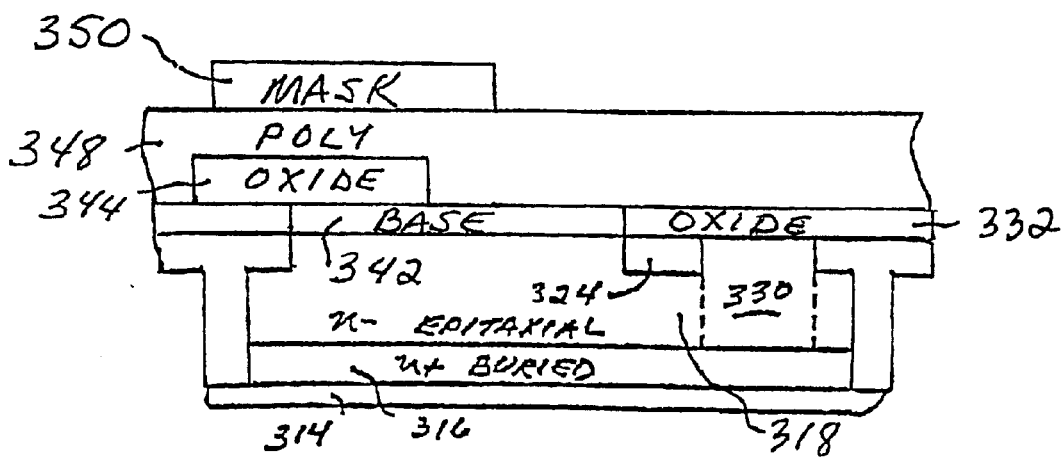

As shown in FIG. 3F, after poly layer 348 has been doped, poly layer 348 is planarized using a conventional approach, such as chemical-mechanical-polishing, to have a single-level top surface. Following this, a poly-etch mask 350 is formed and patterned on poly layer 348. Mask 350 is patterned to define the footprint of the to-be-formed extrinsic emitter which, in turn, includes the length and width of an end region.

Figure 3G:
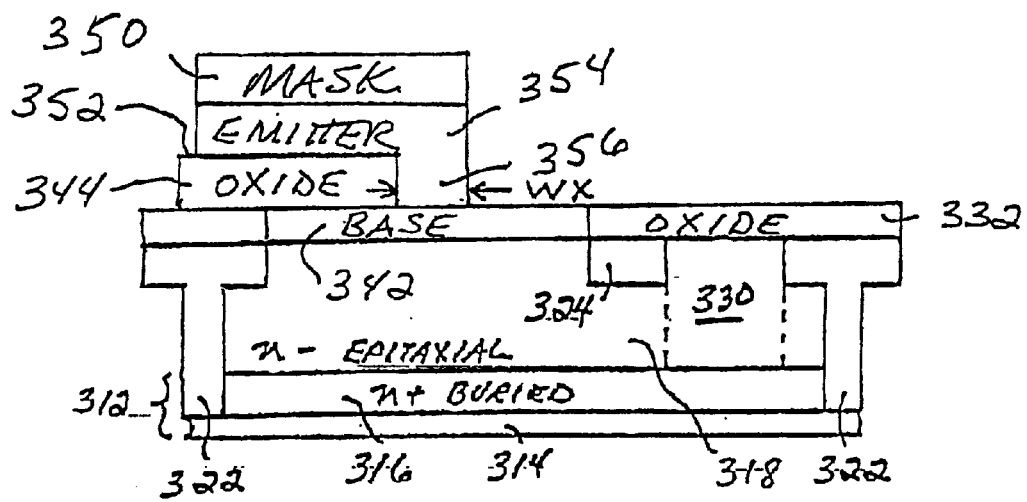

As shown in FIG. 3G, once mask 350 has been patterned, the exposed regions of poly layer 348 are etched away to expose the top surface of intrinsic base 342, expose a top surface 352 of oxide layer 344, and form an extrinsic emitter 354 that contacts base 342. Extrinsic emitter 354 has an end 356 that has a width WX (width WD in FIG. 2) and a length of, for example, 100 nm×150 nm. The etch is a timed etch, and care must be exercised to insure that the surface of intrinsic base 342 is not overetched. Following this, mask 350 is stripped.

Figure 4:
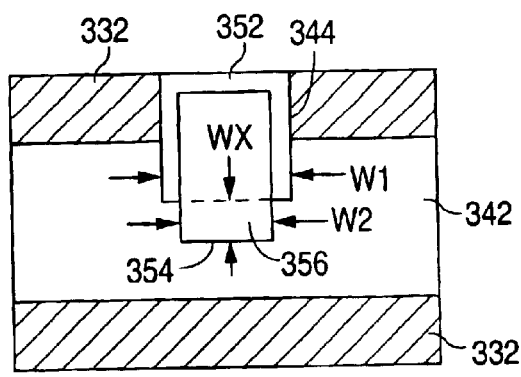
FIG. 4 is a plan view illustrating top surface 352 of oxide layer 344 following the etch of poly layer 348 in accordance with the parent invention.

FIG. 4 shows a plan view that illustrates top surface 352 of oxide layer 344 following the etch of poly layer 344 in accordance with the parent invention. As shown in FIG. 4, oxide layer 344 has a width W1 that is wider than a width W2 of extrinsic emitter 354 (width W2 is equal to the length of end 356). Width W1 is larger than width W2 to accommodate misalignment error and insure that only end 356 of extrinsic emitter 354 contacts intrinsic base 342.

Figure 5:
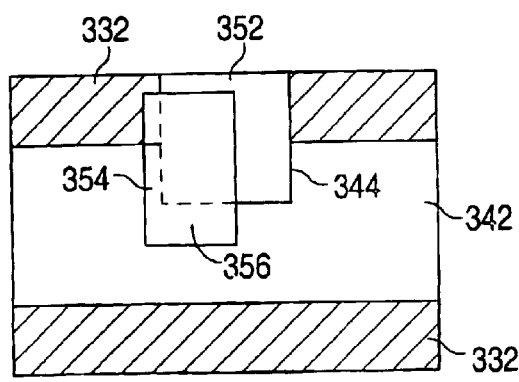
FIG. 5 is a plan view illustrating top surface 352 of oxide layer 344 following a misaligned etch of poly layer 348 when widths W1 and W2 are initially formed to be the same.

FIG. 5 shows a plan view that illustrates top surface 352 of oxide layer 344 following a misaligned etch of poly layer 348 when widths W1 and W2 are initially formed to be the same. As shown in FIG. 5, the area of top surface 352 is greater than the area of top surface 352 shown in FIG. 4 because one side of extrinsic emitter 354 is off of oxide layer 344 and in contact with p– intrinsic base 342. If more than the end 356 of extrinsic emitter 354 is formed on base 342, then device performance can be significantly altered. This type of misalignment can vary across the wafer causing device performance variability.

In accordance with the parent invention, after poly layer 348 has been etched, top surface 352 and the underlying regions of oxide layer 344 are selectively removed with a wet etch. The etch self-aligns oxide layer 344 to the overlying extrinsic emitter 354. To avoid further etching of the top surface of intrinsic base 342, an etchant with a very high selectivity for silicon germanium should be utilized.

Figure 6:
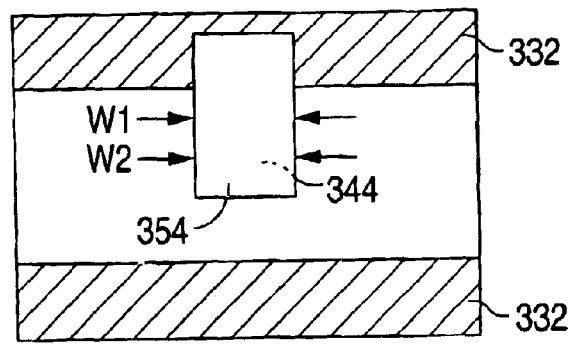
FIG. 6 is a plan view illustrating extrinsic emitter 354 following the etch of oxide layer 344 in accordance with the parent invention.

FIG. 6 shows a plan view that illustrates extrinsic emitter 354 following the etch of oxide layer 344 in accordance with the parent invention. As shown in FIG. 6, in the parent invention, width W1 and width W2 are substantially the same. By reducing the width W1 to be substantially equal to the width W2, the base-to-emitter contact area is substantially reduced which, in turn, reduces the base-to-emitter capacitance.

Figure 3H:
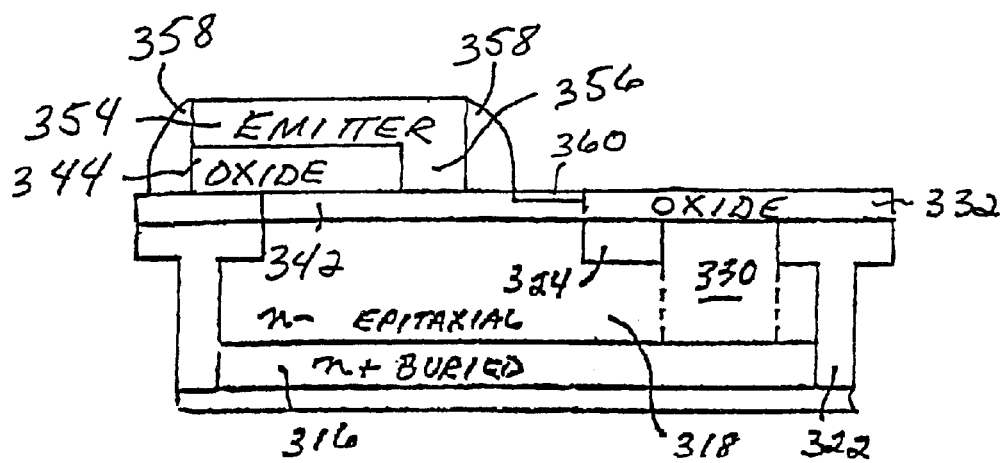

Returning to FIG. 3G, after mask 350 has been removed, a layer of isolation material (not shown), such as oxide, approximately 300 nm thick is formed on intrinsic base 342 and extrinsic emitter 354. Next, as shown in FIG. 3H, the layer of isolation material is anisotropically etched to form isolation side-wall spacers 358.

Once side wall spacers 358 have been formed, wafer 310 is blanket implanted with a p-type dopant to form an extrinsic base region 360 in intrinsic base region 342. (A blanket implant can be used as the dopant concentration of extrinsic emitter 354 is substantially greater.)

Figure 3I:
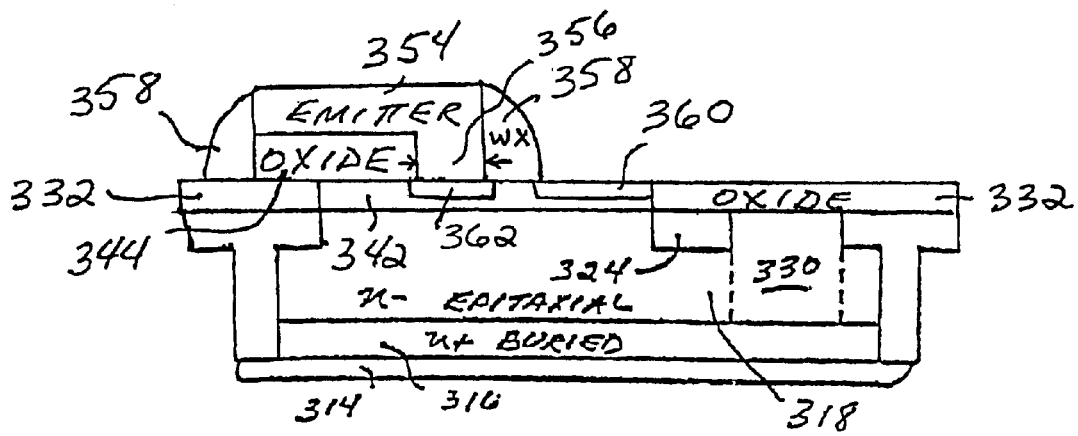

Next, as shown in FIG. 3I, wafer 310 is subject to rapid thermal annealing (RTA). During the RTA process, dopants from n+ extrinsic emitter 354 diffuse into p– intrinsic base 342 to form an n+ intrinsic emitter region 362 in intrinsic base 342. The RTA process also activates the implants. (Intrinsic emitter region 362 has a high dopant concentration due to the high dopant concentration of extrinsic emitter 354.)

One of the advantages of the parent invention is that end 356 can be formed to have a sub-lithographic width WX. (Although an end 356 having a width and length of 100 nm×150 nm was described earlier, an end 356 with a width and length of, for example, 50 nm×150 nm is also possible using the same photolithographic process). As a result, intrinsic emitter region 362 can also be formed to have a smaller size. The smaller size of intrinsic emitter region 362, in turn, reduces the magnitude of the current that can flow through the bipolar transistor, thereby reducing the power consumption.

Figure 3J:
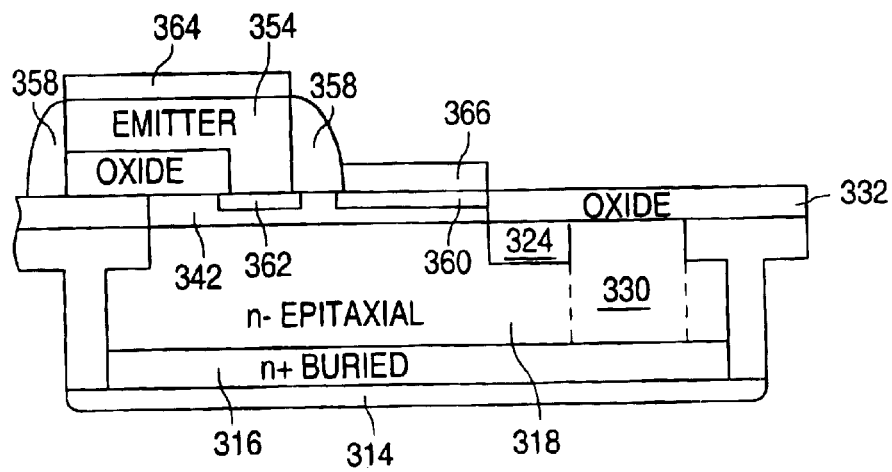

Following this, as shown in FIG. 3J, a layer of metal is formed over intrinsic base 342, extrinsic emitter 354, and spacers 358. The layer of metal is then reacted (heated) to form an emitter suicide layer 364 and a base silicide layer 366. (Silicon is consumed when layers 364 and 366 are formed by direct reaction.) The metal does not react with the material used to form spacers 358, and is subsequently removed. The method then continues with conventional steps.

Thus, a method for forming a bipolar transistor in accordance with the parent invention has been described. The parent method forms a silicon germanium intrinsic base 342 that is self-aligned with, and isolated by, a surrounding layer of oxide 332 without using a mask. In addition, the area of base 342 and the location of the base-to-collector interface are defined by the area and location of mask 336.

Further, the parent method reduces the base-to-emitter contact area, and thereby the base-to-emitter capacitance, by forming oxide layer 344 to be self-aligned with extrinsic emitter 354. In addition, the parent method reduces the maximum current, and thereby the power, that is consumed by the bipolar transistor by forming a small intrinsic emitter region.

Another one of the advantages of the parent invention is that transistor 200 is formed with a single polysilicon fabrication process. This is much less expensive and complex than a double polysilicon process. Further, since the poly-1 to poly-2 interface has been eliminated, dopant diffusion is enhanced during the RTA step. In addition, the method forms an extrinsic base with a higher dopant concentration than intrinsic base 342.

Figure 7:
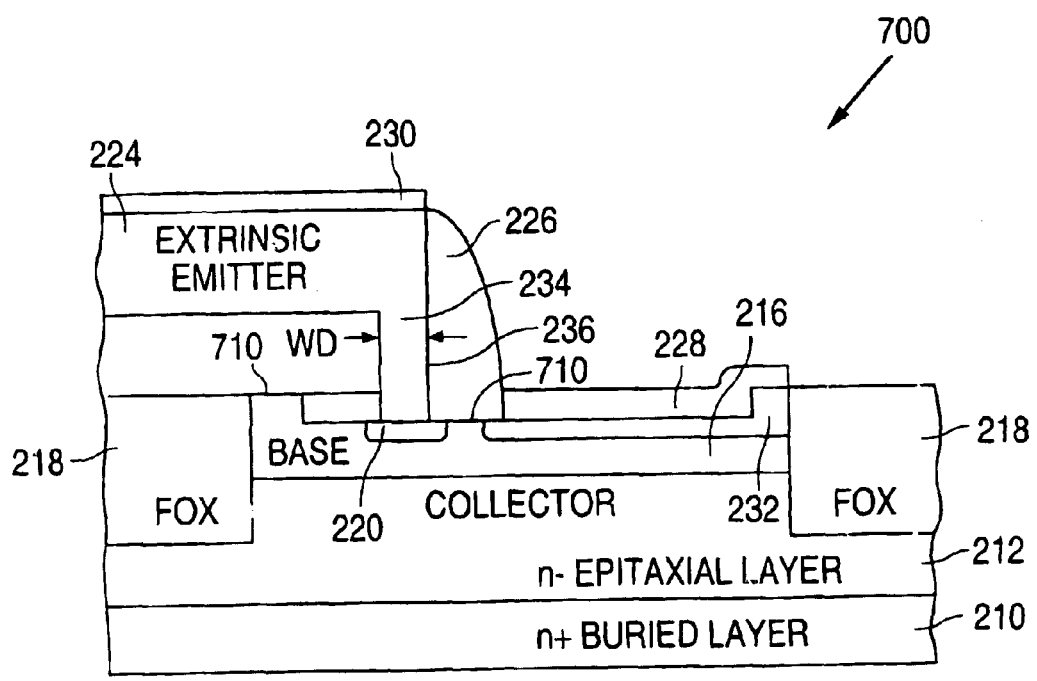
FIG. 7 is a cross-sectional view illustrating a portion of a bipolar transistor 700 in accordance with the present invention.

FIG. 7 shows a cross-sectional view that illustrates a portion of a bipolar transistor 700 in accordance with the present invention. Transistor 700 is similar to transistor 200 and, as a result, utilizes the same reference numerals to designate the structures that are common to both transistors. As shown in FIG. 7, transistor 700 differs from transistor 200 in that transistor 700 has a first base surface 710, and a vertically spaced-apart second base surface 712.

Figure 8A:
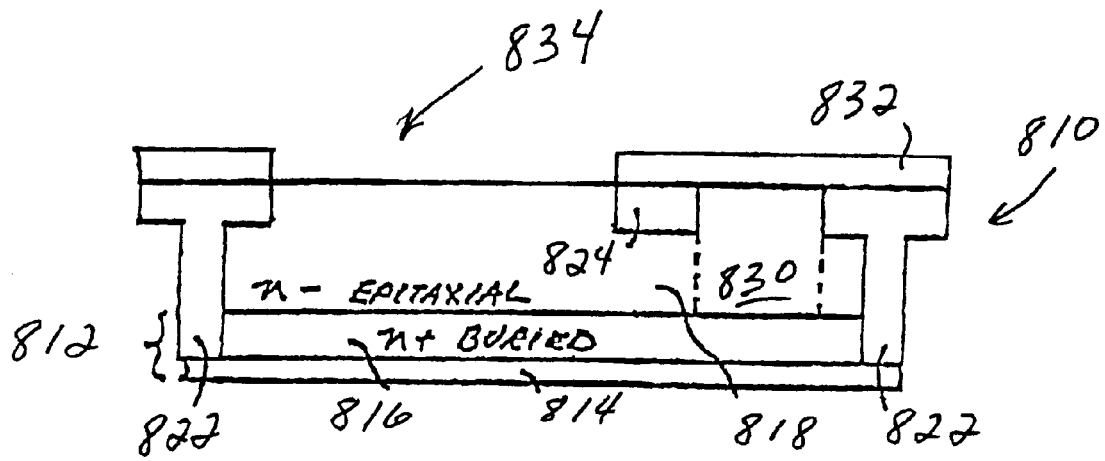
FIGS. 8A–8L are cross-sectional views illustrating a method of forming a bipolar transistor, such as bipolar transistor 700, in accordance with the present invention.

FIGS. 8A–8L show cross-sectional views that illustrate a method of forming a bipolar transistor, such as bipolar transistor 700, in accordance with the present invention. As shown in FIG. 8A, the method utilizes a conventionally-formed wafer 810 that has a semiconductor layer 812. Semiconductor layer 812, in turn, has a substrate layer 814, such as silicon or oxide, and an n+ buried layer 816. In addition, wafer 810 also has a lightly-doped n-type epiaxial layer 818 that is formed on n+ buried layer 816.

Wafer 810 further has a deep trench isolation region 822 that isolates epitaxial layer 818 from laterally adjacent regions. A shallow trench isolation region 824 is also formed in epitaxial layer 818. Shallow trench isolation region 824 separates a collector area of epitaxial layer 818 from a base area of epitaxial layer 818 of the to-be-formed bipolar transistor.

In addition, wafer 810 can optionally include an n+ diffused contact region 830 that extends down from the surface of the collector area in epitaxial layer 818 to contact n+ buried layer 816. Contact region 830 is utilized to reduce the series resistance to buried layer 816. N+ buried layer 816, n– epitaxial layer 818, and optional n+ diffused contact region 830 define the collector of the to-be-formed bipolar transistor.

As shown in FIG. 8A, the method of the present invention begins by forming a layer of masking material 832 on epitaxial layer 818. Once formed, the layer of masking material 832 is then patterned to expose a trench region 834 on the top surface of epitaxial layer 818.

Figure 8B:
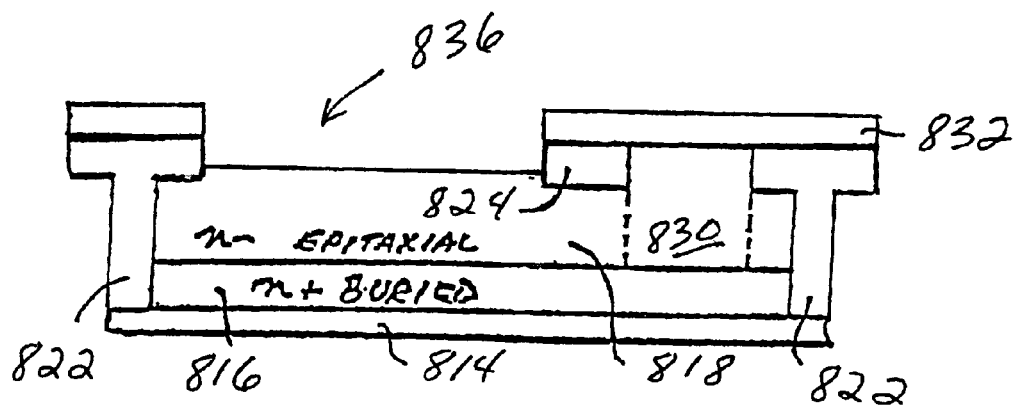
Figure 8C:
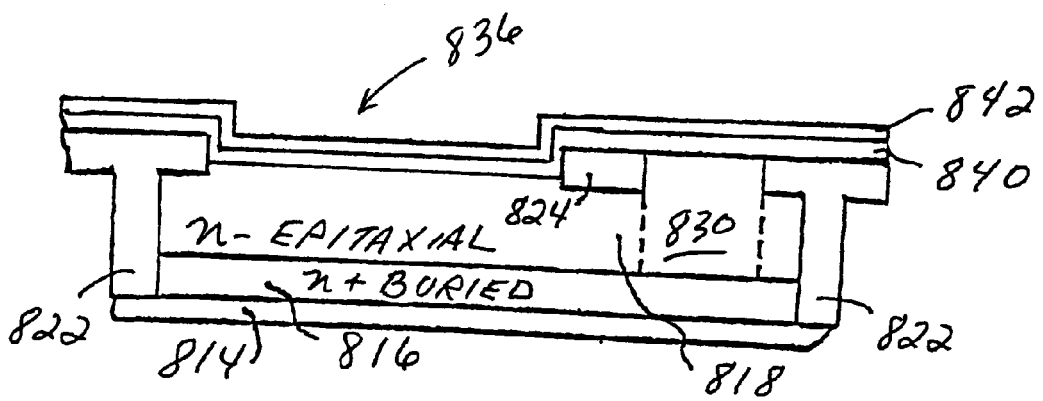

Referring to FIG. 8B, once masking material 832 has been patterned, trench region 834 is anisotropically etched until a trench 836 has been formed in epitaxial layer 818. Following the etch, masking material 832 is removed. Referring to FIG. 8C, after material 832 has been removed, a layer of base material 840 is formed on epitaxial layer 818, including trench 836. The layer of base material 840, which is conventionally doped to have a p-type conductivity, includes silicon and germanium, and can also include carbon. Following this, a layer of protective material 842, such as oxide, is formed on base material 840.

Figure 8D:
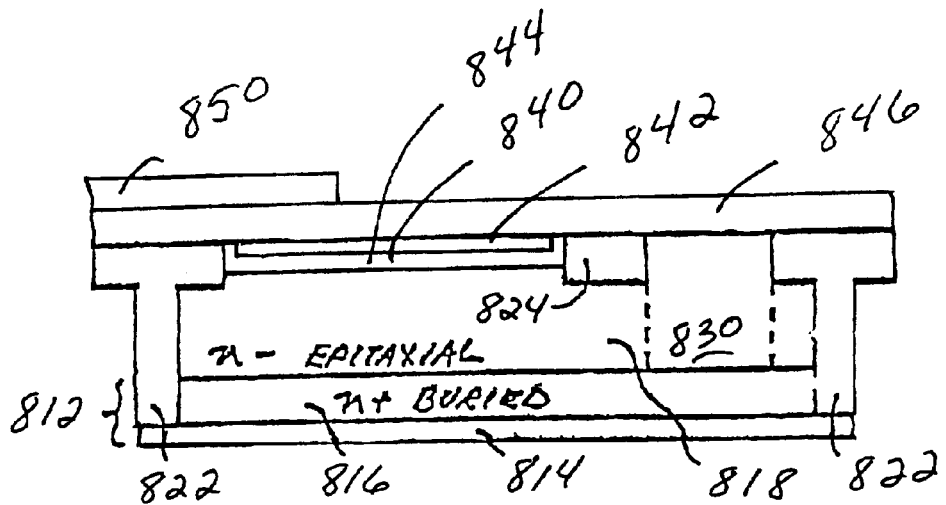

Referring to FIG. 8D, once protective layer 842 has been formed, epitaxial layer 818, base material 840Q and protective layer 842 are chemically-mechanically polished until the top surface of protective layer 842 is substantially coplanar with the top surface of epitaxial layer 818. The chemical mechanical polishing step forms an intrinsic base region 844.

Following this, a layer of isolation material 846, such as pad oxide, is formed on epitaxial layer 818, intrinsic base region 844, and protective layer 842. After isolation layer 846 has been formed, an isolation mask 850 is formed and patterned on isolation layer 846.

Figure 8E:
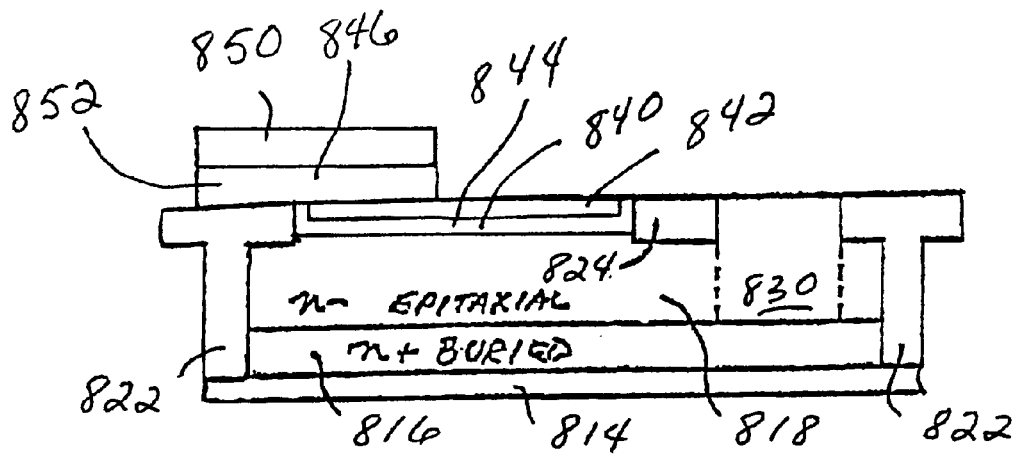

Referring to FIG. 8E, following the patterning of mask 850, the exposed portion of isolation layer 846 is etched until isolation layer 846 has been removed from the surface of epitaxial layer 818 and protective layer 842. The etch forms an isolation region 852. After the etch has been, completed, mask 850 is removed.

Figure 8F:
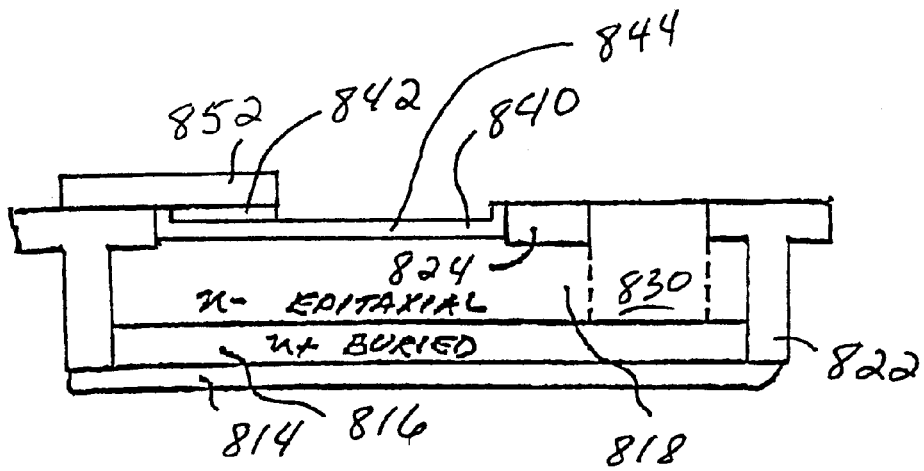

Next, as shown in FIG. 8F, in accordance with the present invention, the exposed region of protective layer 842 is next removed from intrinsic base region 844 with a wet etch. The etchant chemistry is selected to minimize damage to intrinsic base region 844.

Figure 8G:
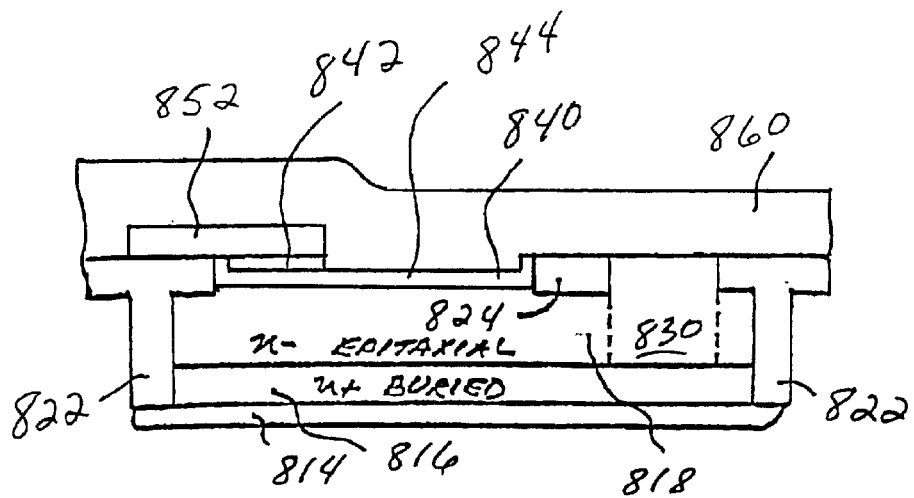

After the etch, as shown in FIG. 8G, a layer of polysilicon (poly) 860 approximately 250 nm thick is deposited on epitaxial layer 818, intrinsic base region 844, and isolation region 852. Poly layer 860 is conventionally doped with phosphorous or arsenic, such as by ion implantation or diffusion, to have a high (n+) dopant concentration.

Figure 8H:
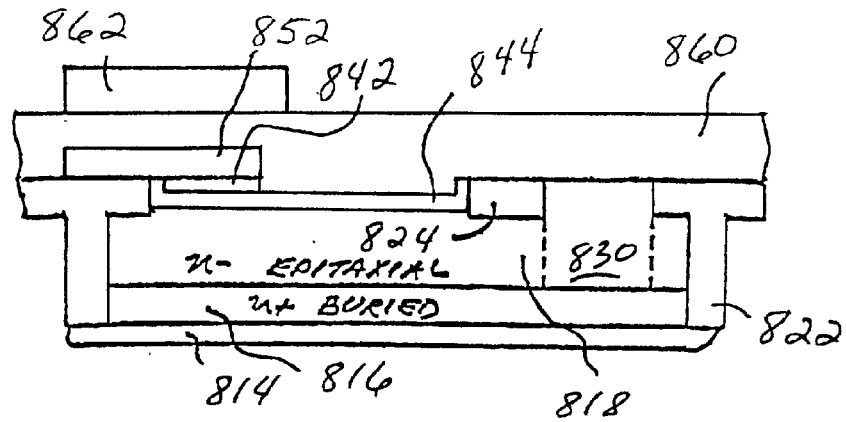

Referring to FIG. 8H, after poly layer 860 has been doped, poly layer 860 is planarized using a conventional approach, such as chemical-mechanical polishing, to have a single level top surface. Following this, an emitter etch mask 862 is formed and patterned on poly layer 860. Mask 862 is defined to form the footprint of the to-be-formed extrinsic emitter which, in turn, includes the length and width of an end region.

Figure 8I:
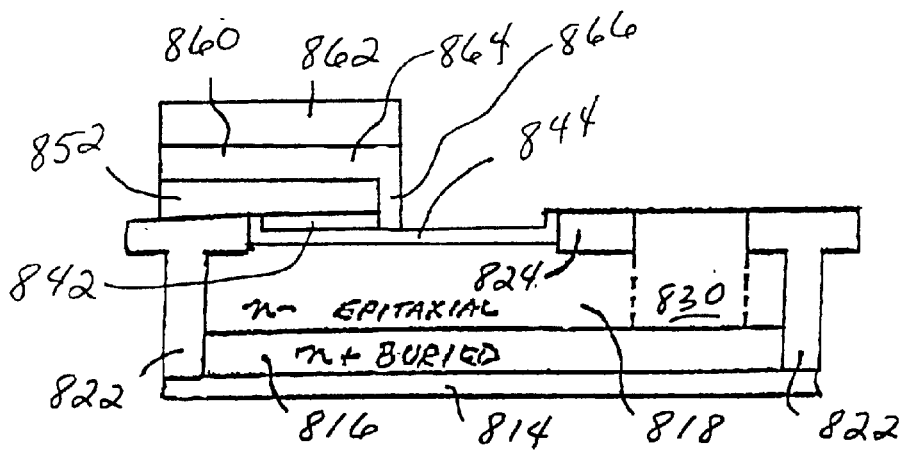
Figure 8J:
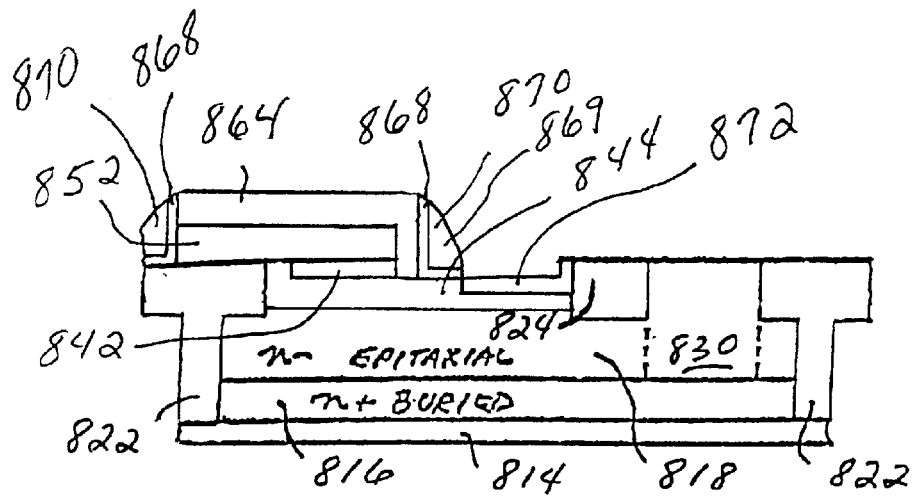

Referring to FIG. 8I, once mask 862 has been patterned, the exposed regions of poly layer 860 are etched away to expose the top surface of intrinsic base region 844. The etch also forms an extrinsic emitter 864 with an end 866 that contacts intrinsic base region 844. The etch is a timed etch and care must be exercised to insure that the surface of intrinsic base region 844 is not overetched. Following this, mask 862 is stripped.

Returning to FIG. 8J, after mask 862 has been removed, a first layer of isolation material 868, such as oxide, is formed on intrinsic base region 844 and extrinsic emitter 864. Following this, a second layer of isolation material 869, such as nitride, approximately 300 nm thick is formed on isolation layer 866. Next, the second layer of isolation material 869 is anisotropically etched to form isolation sidewall spacers 870.

Once side wall spacers 870 have been formed, wafer 810 is wet etched to remove isolation layer 868 from the surface of intrinsic base region 844. By using a two step etch process to form spacers 870 and expose the surface of intrinsic base region 844, intrinsic base region 844 is protected during the anisotropic etch step used to form spacers 870. After this, wafer 810 is blanket implanted with a p-type dopant to form an extrinsic base region 872 in intrinsic base region 844. (A blanket implant can be used as the dopant concentration of extrinsic emitter 864 is substantially greater.)

Figure 8K:
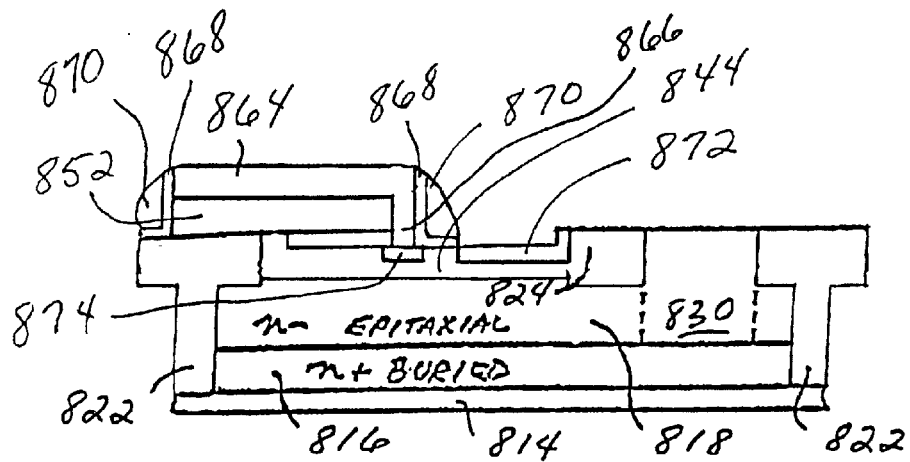

Next, as shown in FIG. 8K, wafer 810 is subject to rapid thermal annealing (RTA). During the RTA process, dopants from n+ extrinsic emitter 864 diffuse into p− intrinsic base 844 to form an n+ intrinsic emitter region 874 in intrinsic base region 844. The RTA process also activates the implants. (Intrinsic emitter region 874 has a high dopant concentration due to the high dopant concentration of extrinsic emitter 864.)

As with the parent invention, one of the advantages of the present invention is that end 866 can be formed to have a sub-lithographic width WX (see FIG. 7). (Although an end (end 356) having a width and length of 100 nm×150 nm was described earlier, an end with a width and length of, for example, 50 nm×150 nm is also possible using the same photolithographic process). As a result, intrinsic emitter region 874 can also be formed to have a smaller size. The smaller size of intrinsic emitter region 874, in turn, reduces the magnitude of the current that can flow through the bipolar transistor, thereby reducing the power consumption.

Figure 8L:
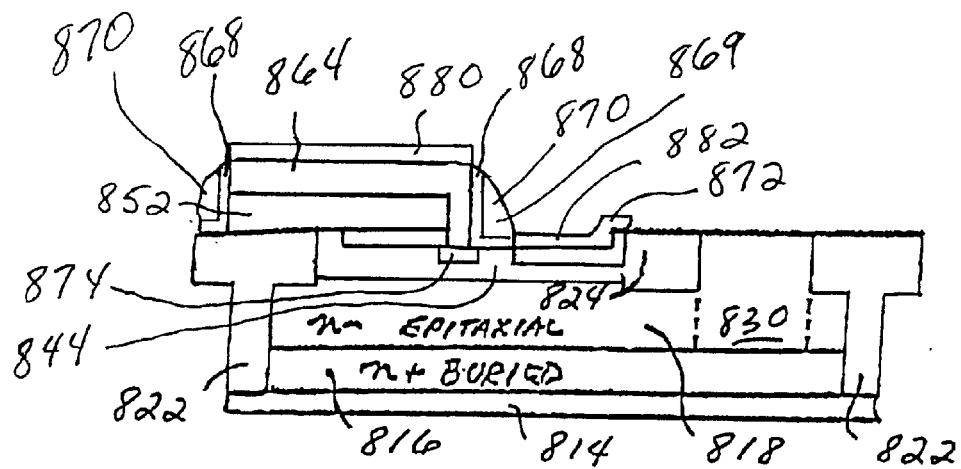
Figure 1:
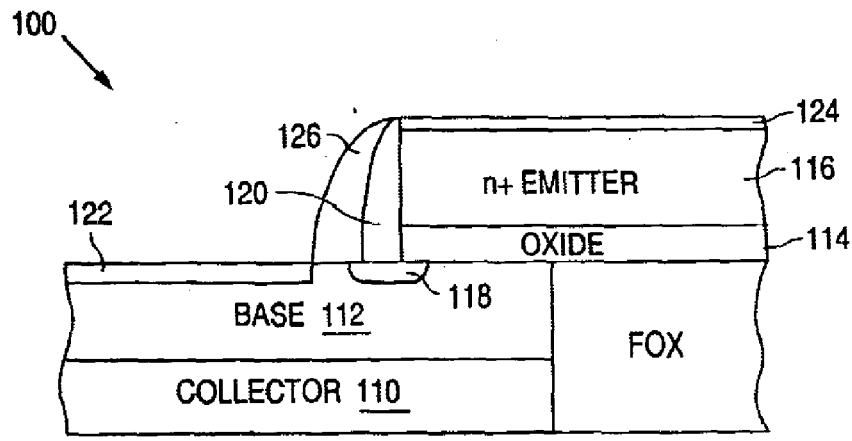
Figure 2:
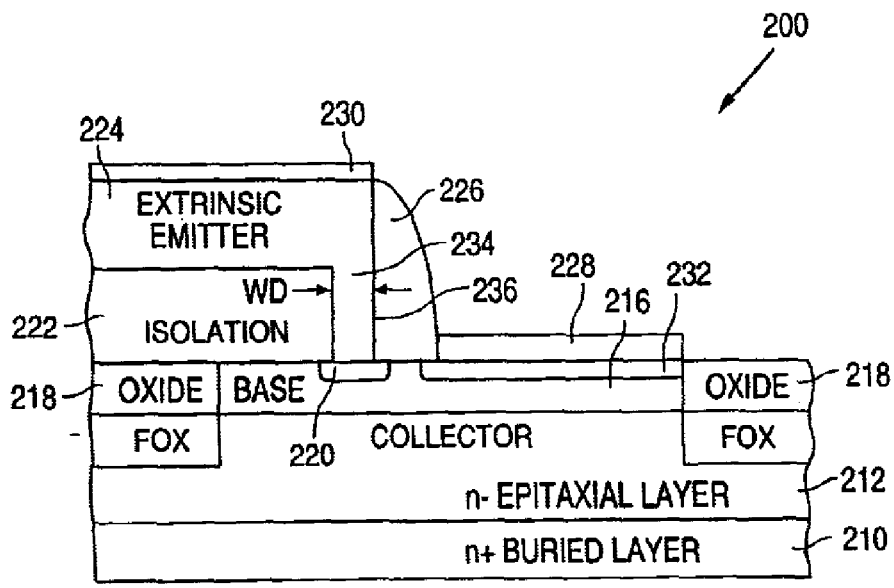
Figure 3A:
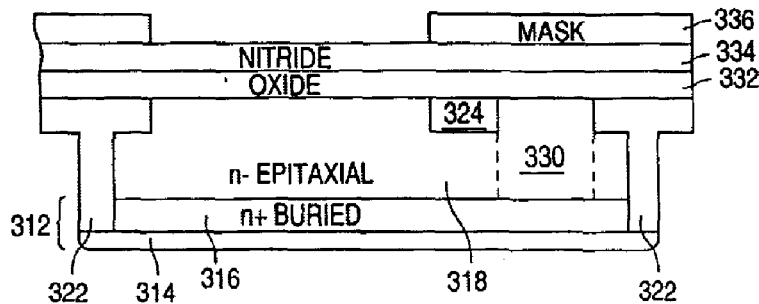
Figure 3B:
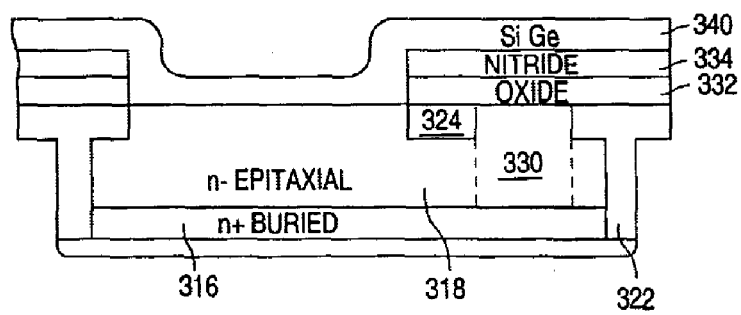
Figure 3C:
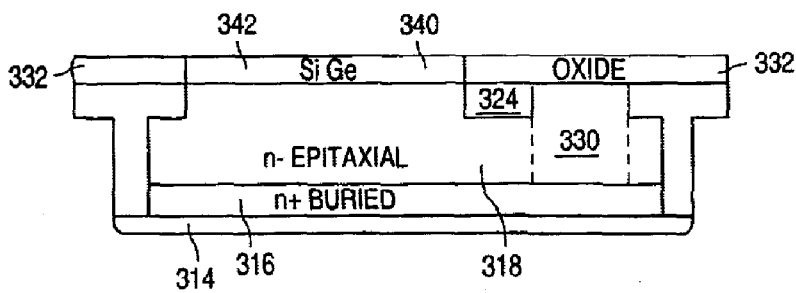
Figure 3D:
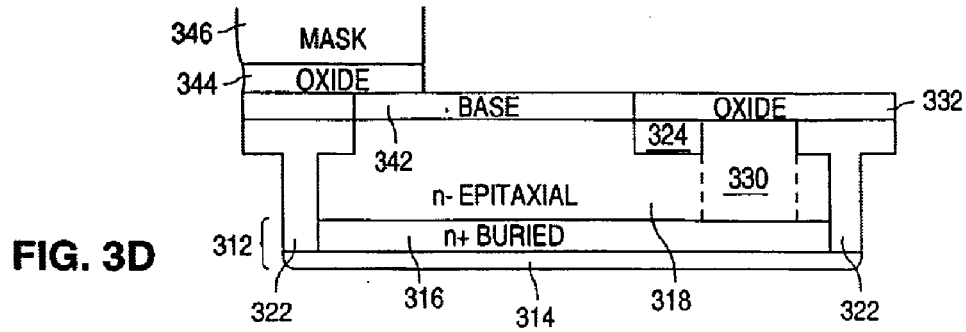
Figure 3E:
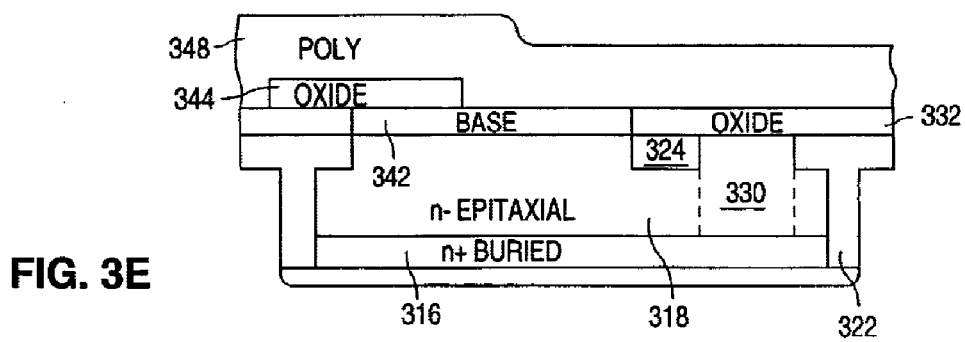
Figure 3F:
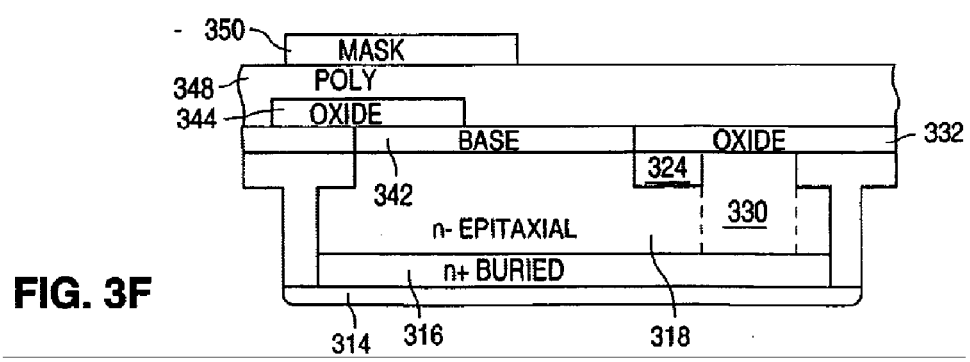
Figure 3G:
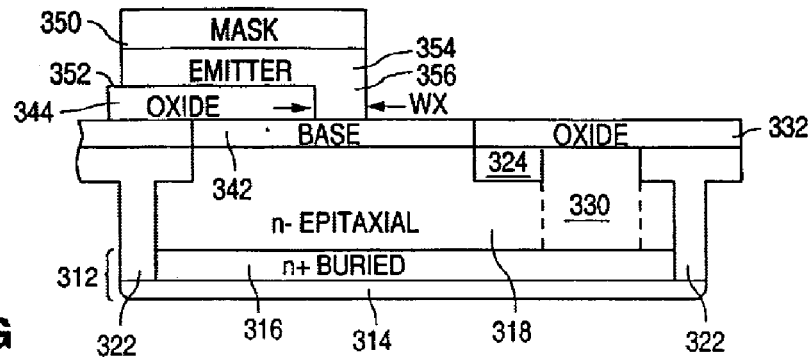
Figure 3H:
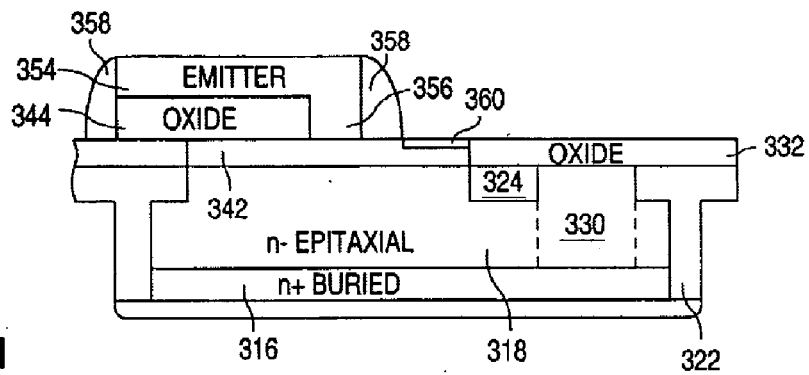
Figure 3I:
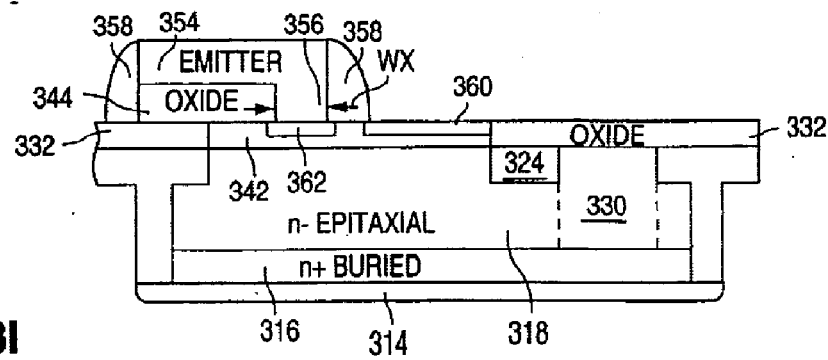
Figure 8A:
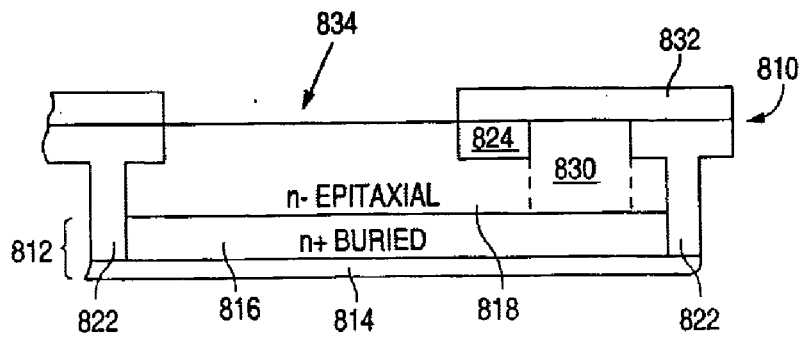
Figure 8B:
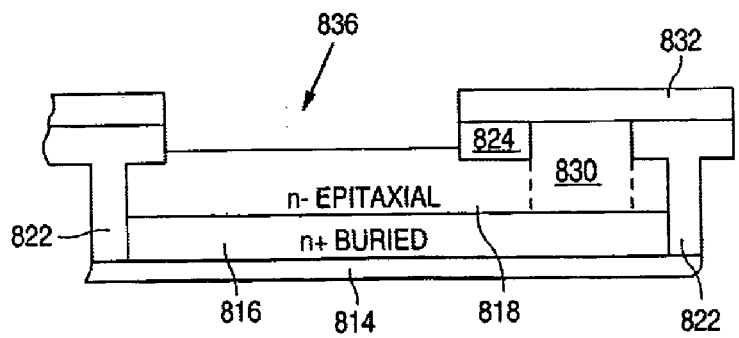
Figure 8C:
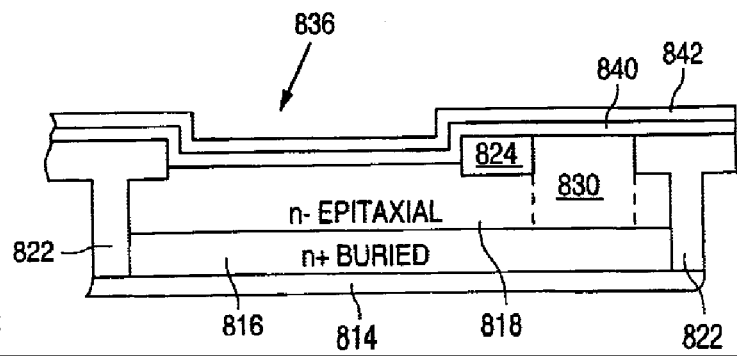
Figure 8D:
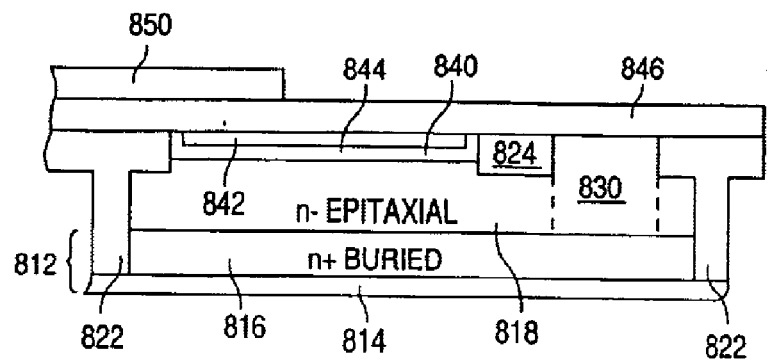
Figure 8E:
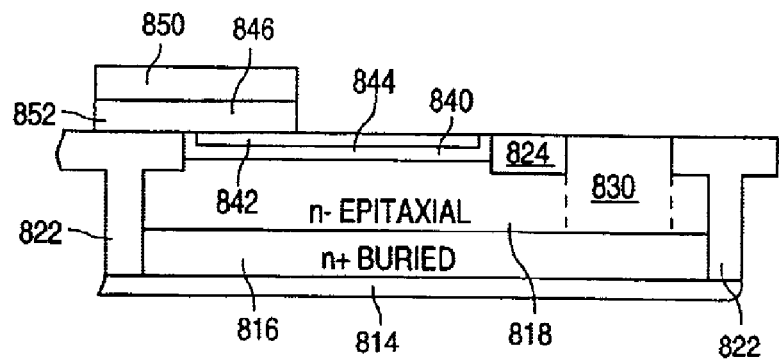
Figure 8F:
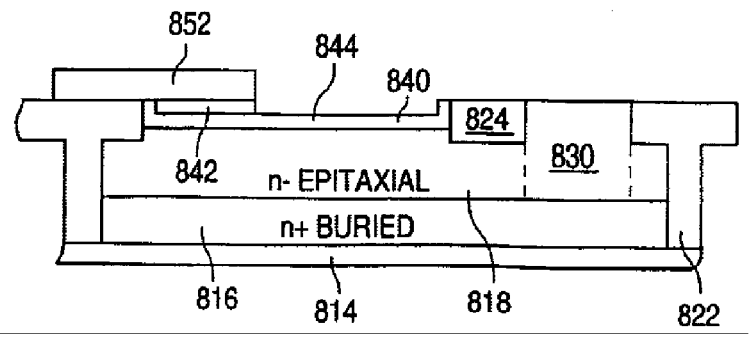
Figure 8G:
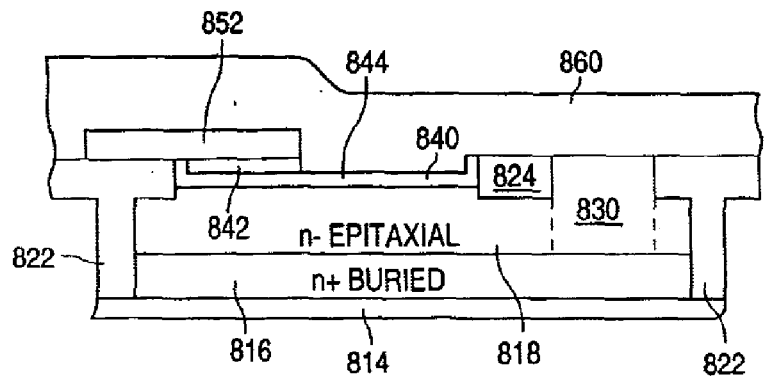
Figure 8H:
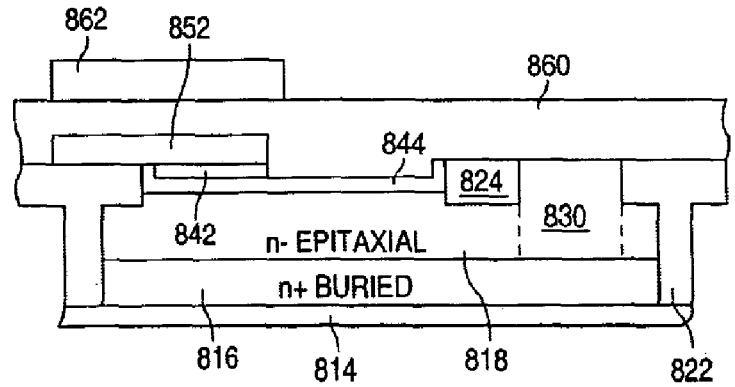
Figure 8I:
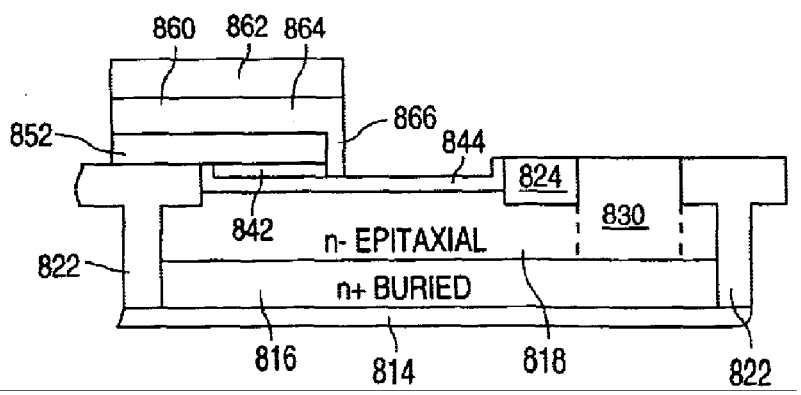
Figure 8J:
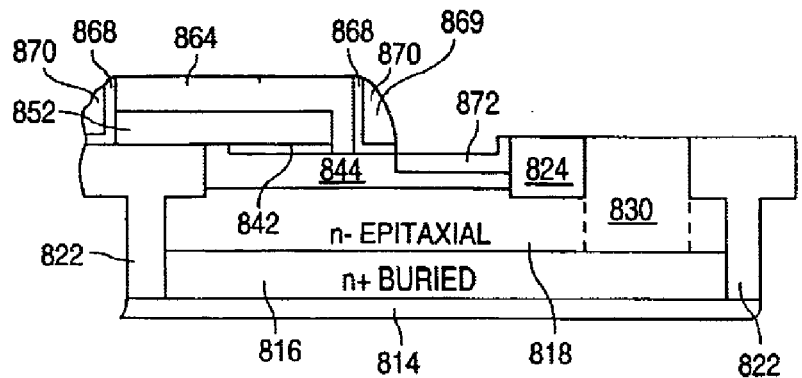
Figure 8K:
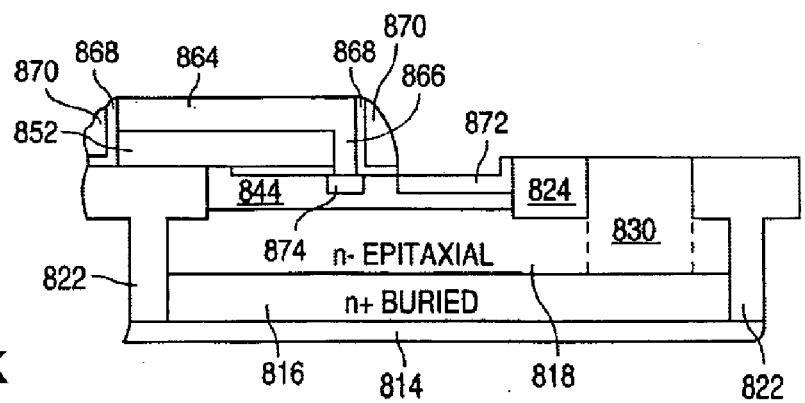
Figure 8L:
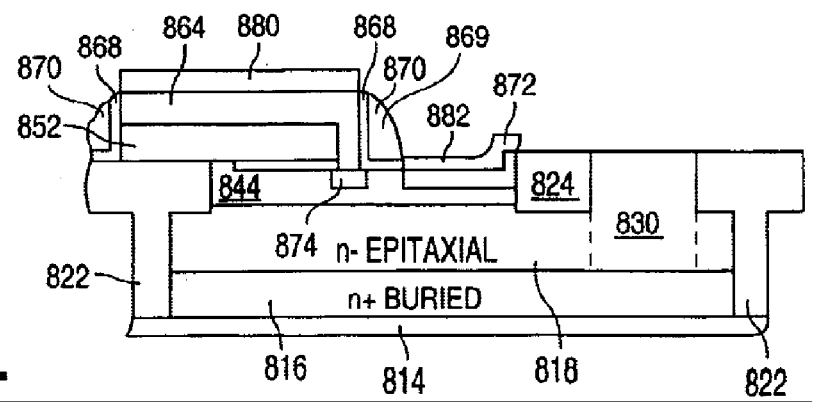

Following this, as shown in FIG. 8L, a layer of metallic material is formed over intrinsic base region 844, extrinsic emitter 864, and spacers 870. The layer of metallic material is then reacted (heated) to form an emitter silicide layer 880 and a base silicide layer 882. (Silicon is consumed when layers 880 and 882 are formed by direct reaction.) The metal does not react with the material used to form spacers 870, and is subsequently removed. The method then continues with conventional steps.

Thus, the present invention forms a bipolar transistor that has all of the advantages of the bipolar transistor described in the parent invention. In addition, the present invention also has the additional advantage of using a chemical-mechanical polishing step that does not interact with the base material (that includes silicon and germanium, and can include carbon) used to form the intrinsic base region.

It should be understood that various alternatives to the method of the invention described herein may be employed in practicing the invention. For example, although the material is described with respect to npn transistors, the method applies equally well to pnp transistors where the conductivity types are reversed.

In addition, the present method can be incorporated into a BiCMOS process. Thus, it is intended that the following claims define the scope of the invention and that methods and structures within the scope of these claims and their equivalents be covered thereby.

What is claimed is:

1. A method of forming a bipolar transistor on a wafer, the wafer having a buried layer and an epitaxial layer of a first conductivity type formed over the buried layer, the epitaxial layer having a top surface and a smaller dopant concentration than the buried layer, the method comprising the steps of:

forming a trench in the epitaxial layer;

forming a layer of base material on the epitaxial layer and the trench;

forming a layer of base protection material on the layer of base material; and chemically-mechanically polishing the layer of base material and the layer of base protection material until the top surface of the epitaxial layer and a top surface of the layer of base protection material are substantially coplanar.

2. The method of claim 1 wherein the layer of base material includes silicon and germanium.

3. The method of claim 1 wherein the layer of base material includes silicon, germanium, and carbon.

4. The method of claim 1 and further comprising the step of removing a portion of the layer of base protection material to expose a portion of the layer of base material, the base material being conductive, the base protection material being non-conductive.

5. The method of claim 4 and further comprising the steps of:

forming a layer of conductive material on the portion of the layer of base material and the isolation region; and etching the layer of conductive material to form an extrinsic emitter and an exposed base region, the extrinsic emitter contacting the layer of base material and the top surface of the isolation region.

6. The method of claim 5 and further comprising the steps of:

etching the isolation region such that a side wall of the extrinsic emitter and a side wall of the isolation region are substantially aligned; and forming a sidewall spacer adjacent to the sidewalls of the extrinsic emitter over the exposed base region.

7. A method of forming a bipolar transistor on a wafer, the wafer having a buried layer and an epitaxial layer of a first conductivity type formed over the buried layer, the epitaxial layer having a top surface and a smaller dopant concentration than the buried layer, the method comprising the steps of:

forming a trench in the epitaxial layer;

forming a layer of base material on the epitaxial layer and the trench;

forming a layer of base protection material on the layer of base material; and chemically-mechanically polishing the layer of base material and the layer of base protection material until the top surface of the epitaxial layer and a top surface of the layer of base protection material are substantially coplanar;

removing a portion of the layer of base protection material to expose a portion of the layer of base material, the base material being conductive, the base protection material being non-conductive.

8. The method of claim 7 wherein the portion of the layer of base protection material is removed with a wet etch.

9. The method of claim 8 wherein an area and location of a base-to-collector junction is defined by the trench.

10. The method of claim 7 and further comprising the step of forming an isolation region on the layer of base material and the layer of base protection material.

11. The method of claim 10 wherein the step of forming an isolation region includes the steps of:

forming a layer of isolation material on the epitaxial layer, the layer of base material, and the layer of base protection material; and etching a portion of the layer of isolation material to expose a portion of the layer of base protection material.

12. The method of claim 10 and further comprising the steps of:

forming a layer of conductive material on the portion of the layer of base material and the isolation region; and etching the layer of conductive material to form an extrinsic emitter and an exposed base region, the extrinsic emitter contacting the layer of base material and the top surface of the isolation region.

13. The method of claim 12 and further comprising the step of planarizing the layer of conductive material prior to the step of etching the layer of conductive material.

14. The method of claim 12 wherein the step of etching the layer of conductive material is a timed etch.

15. The method of claim 12 wherein the extrinsic emitter has an end that contacts the layer of base material, the end having a substantially vertical end wall.

16. The method of claim 12 and further comprising the steps of:

etching the isolation region such that a side wall of the extrinsic emitter and a side wall of the isolation region are substantially aligned; and forming a first layer of insulation material on the exposed base region and the extrinsic emitter.

17. The method of claim 16 wherein a width of the extrinsic emitter is less than a width of the isolation region, the width of the extrinsic emitter and the width of the isolation region being measured along a line substantially perpendicular to a plane that includes substantially all of a side wall of the extrinsic emitter.

18. The method of claim 16 and further comprising the steps of:

forming a second layer of insulation material on the first layer of insulation material;

etching the second layer of insulation material to form an exposed region of the first layer of insulation material and a side wall spacer that adjoins the extrinsic emitter;

etching the exposed region of the first layer of insulation material to remove the first layer of insulation material from the base material;

forming an extrinsic base region in the layer of base material after the first layer of insulation material has been etched; and forming an intrinsic emitter region in the layer of base material after the extrinsic base region has been formed.

19. The method of claim 18 wherein the step of forming an intrinsic emitter region includes the step of annealing the wafer to cause dopants to outdiffuse from the extrinsic emitter into the base material.

20. The method of claim 12 wherein the layer of conductive material is polysilicon.

21. The method of claim 20 wherein the layer of conductive material is doped to have the first conductivity type.

22. A method of forming a bipolar transistor on a wafer, the wafer having a semiconductor material of a first conductivity type, the semiconductor material having a top surface, the method comprising the steps of:

forming a trench in the semiconductor material;

forming a layer of base material on the semiconductor material and the trench;

forming a layer of base protection material on the layer of base material; and chemically-mechanically polishing the layer of base material and the layer of base protection material until the top surface of the semiconductor material and a top surface of the layer of base protection material are substantially coplanar.

23. The method of claim 22 and further comprising the step of forming an isolation region on the layer of base material and the layer of base protection material.

* * * * *

UNITED STATES PATENT AND TRADEMARK OFFICE
CERTIFICATE OF CORRECTION

PATENT NO. : 6,753,234 B1
DATED : June 22, 2004
INVENTOR(S) : Abdalla Aly Naem

It is certified that error appears in the above-identified patent and that said Letters Patent is hereby corrected as shown below:

Title page,
Item [56], References Cited, OTHER PUBLICATIONS,
Line 7, delete "Disclsure" and replace with -- Disclosure --.

Drawings,
Delete Figures 1-31 and 8A-8L, and insert replacement sheets Figures 1-31 and 8A-8L.

Column 2,
Line 2, delete "lowpower" and replace with -- low-power --.
Line 7, delete "100." and replace with -- 100 --.
Line 9, delete "layers" and replace with -- layer, --.
Line 21, delete "suicide" and replace with -- silicide --.

Column 4,
Line 36, delete "and," and replace with -- and --.

Column 7,
Line 20, delete "suicide" and replace with -- silicide --.
Line 63, delete "epiaxial" and replace with -- epitaxial --.

Column 8,
Line 31, delete "840Q" and replace with -- 840, --.
Line 46, delete "been," and replace with -- been --.

Column 9,
Line 16, delete "sidewall spacers" and replace with -- sidewall-spacers --.

Signed and Sealed this

Fifteenth Day of February, 2005

JON W. DUDAS
*Director of the United States Patent and Trademark Office*